US006992437B2

(12) United States Patent
Lee et al.

(10) Patent No.: US 6,992,437 B2
(45) Date of Patent: Jan. 31, 2006

(54) ORGANIC ELECTROLUMINESCENT DISPLAY DEVICE

(75) Inventors: Jun-Yeob Lee, Seongnam (KR); Yong-Joong Choi, Yongin (KR)

(73) Assignee: Samsung SDI Co., Ltd., Suwon-si (KR)

( * ) Notice: Subject to any disclaimer, the term of this patent is extended or adjusted under 35 U.S.C. 154(b) by 152 days.

(21) Appl. No.: 10/754,107

(22) Filed: Jan. 9, 2004

(65) Prior Publication Data

US 2004/0178720 A1 Sep. 16, 2004

(30) Foreign Application Priority Data

Mar. 13, 2003 (KR) .................. 10-2003-0015862

(51) Int. Cl.
*H01J 1/63* (2006.01)

(52) U.S. Cl. ...................... 313/504; 313/506

(58) Field of Classification Search ............... 313/498, 313/503, 504, 506, 512
See application file for complete search history.

(56) References Cited

U.S. PATENT DOCUMENTS

| | | | |
|---|---|---|---|
| 6,285,039 B1 | 9/2001 | Kobori et al. |
| 6,310,360 B1 | 10/2001 | Forrest |
| 6,392,250 B1 | 5/2002 | Aziz |
| 6,458,475 B1 | 10/2002 | Adachi et al. |
| 6,475,648 B1 | 11/2002 | Hatwar et al. |

*Primary Examiner*—Vip Patel
(74) *Attorney, Agent, or Firm*—Stein, McEwen & Bui, LLP

(57) ABSTRACT

An organic electroluminescent display device, which has a superior efficiency and life cycle characteristics and maintains constant color coordinates as compared to an existing organic electroluminescent display device, includes at least one emission layer and a charge transport layer between a first electrode and a second electrodes. The emission layer includes at least two or more dopants of a host material. The two or more dopants include a first phosphorescent dopant and a second phosphorescent dopant. Each of the first phosphorescent dopant and second phosphorescent dopant includes iridium or platinum.

23 Claims, 1 Drawing Sheet

ORGANIC ELECTROLUMINESCENT DISPLAY DEVICE

CROSS-REFERENCE TO RELATED APPLICATION

This application claims the benefit under 35 U.S.C. § 119 of Korean Patent Application No. 2003-15862, filed on Mar. 13, 2003 in the Korean Intellectual Property Office, the disclosure of which is hereby incorporated herein by reference.

BACKGROUND OF THE INVENTION

1. Field of the Invention

The present invention relates to an organic electroluminescent display device having high efficiency and a long life cycle, more particularly, to an organic electroluminescent display device having a low driving voltage and a superior efficiency and life cycle characteristics by improving an existing emission layer.

2. Description of the Related Art

Recently, an organic electroluminescent display device has been of interest as a next generation display device owing to its merits of a thin shape, wide viewing angle, light weight, miniaturization, fast response speed and low power consumption as compared with a cathode-ray tube (CRT) or a liquid crystal display (LCD). Particularly, an organic electroluminescent display device has the advantage that it can be easily fabricated through a simple fabrication process as it is simply structured of an anode, an organic film layer and a cathode. The organic film layer has various layers, depending on the functions. However, the organic film layer generally has a hole injection layer, a hole transport layer, an emission layer, an electron transport layer and an electron injection layer.

FIG. 1 is a drawing schematically illustrating structure of an ordinary organic electroluminescent display device. A hole is injected from the anode that is a transparent electrode 7 so that the injected hole is transported to an emission layer 4 through a hole injection layer 6 and a hole transport layer 5. An electron is injected from the cathode 1 is transported to the emission layer 4 through an electron injection layer 2 and an electron transport layer 3. The transported electron and hole are joined with each other to emit light.

The emission layer 4 is formed in a structure in which a dopant is doped on a host to transport the electron and the hole to the dopant through the host so that the light is emitted. In case of a phosphorescence organic electroluminescent display device, a phosphorescent material comprising Iridium (Ir) or Platinum (Pt) is used as a dopant.

As a way of improving the efficiency and the life cycle of an organic electroluminescent display device, the doping and the host of the emission layer are improved. For instance, U.S. Pat. No. 6,392,250 shows mixed layer of the hole transport layer 5 and the electron transport layer 3 is used as a host for the dopant to improve the life cycle of the organic electroluminescent display device. In addition, U.S. Pat. No. 6,285,039 shows a method for using a mixed layer of the hole transport layer 5 and the electron transport layer 3 as the host and constructing the emission layer 4 of the two layers to improve luminance of an organic electroluminescent display device.

A method for adding an intersystem crossing agent to the emission layer 4 consisting of the host and the dopant to improve emission efficiency of an organic light emitting device is shown in U.S. Pat. No. 6,310,360. Specifically, a fluorescent material in which the absorption spectrum of the dopant is overlapped with the emission spectrum of the intersystem crossing agent is used as the dopant. A phosphorescent material is used as the intersystem crossing gent to improve emission efficiency of the organic light emitting device. The phosphorescent material used as the intersystem crossing agent is fac-tris(2-phenylpyridine)iridium(Ir(ppy)$_3$), and 3.3% of external quantum efficiency is obtained by using a fluorescent dopant DCM2 as an emitting material. In the above device, energy of a singlet or a triplet transported from the host by using the phosphorescent material as the intersystem crossing agent is transported to the fluorescent dopant so that efficiency of the fluorescent dopant is improved.

However, the foregoing methods are limited as they are applied to the fluorescent material using a singlet energy state only. The foregoing methods have problems of deposition process difficulty and device stability since three types of material have to be co-deposited at the same time. Therefore, a new device structure for having high emission efficiency and stable device characteristics is required.

Furthermore, technology using the intersystem cross agent has a problem in that color purity of the emitting material is deteriorated by an emission peak of the intersystem crossing agent as the emission of the intersystem crossing agent can not be disappeared completely.

SUMMARY OF THE INVENTION

In order to solve the foregoing and/or other problems, it is an aspect of the present invention to provide an active matrix organic electroluminescent device capable of improving luminance with pixel units.

It is an aspect of the present invention to develop structure of a device having high emission efficiency by improving an emission layer when forming an organic electroluminescent display device.

It is another aspect of the present invention to improve the life cycle of the organic electroluminescent display device by improving the emission layer, thereby improving the stability of the organic electroluminescent display device.

It is another aspect of the present invention to increase color purity of the organic electroluminescent display device by improving the emission layer.

It is another aspect of the present invention to stably maintain a process by simplifying the deposition process of the emission layer.

Additional aspects and/or advantages of the invention will be set forth in part in the description which follows and, in part, will be obvious from the description, or may be learned by practice of the invention.

According to an aspect of the present invention; an organic electroluminescent display device includes at least one emission layer and charge transport layer between a first electrode and a second electrode, wherein the emission layer comprises a host material comprising at least two or more dopants comprising a first phosphorescent dopant and a second phosphorescent dopant, and each of the first phosphorescent dopant and second phosphorescent dopant comprises iridium or platinum.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
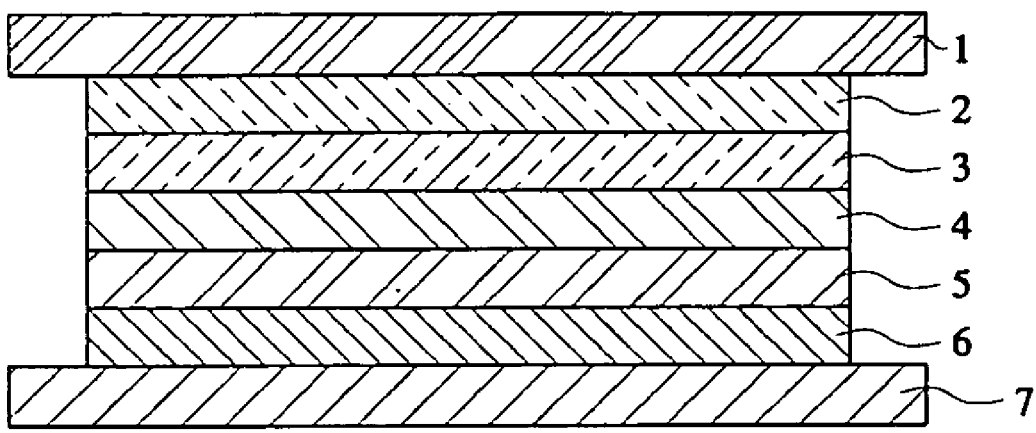
FIG. 1 is a drawing schematically illustrating structure of an ordinary organic electroluminescent display device.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 2:
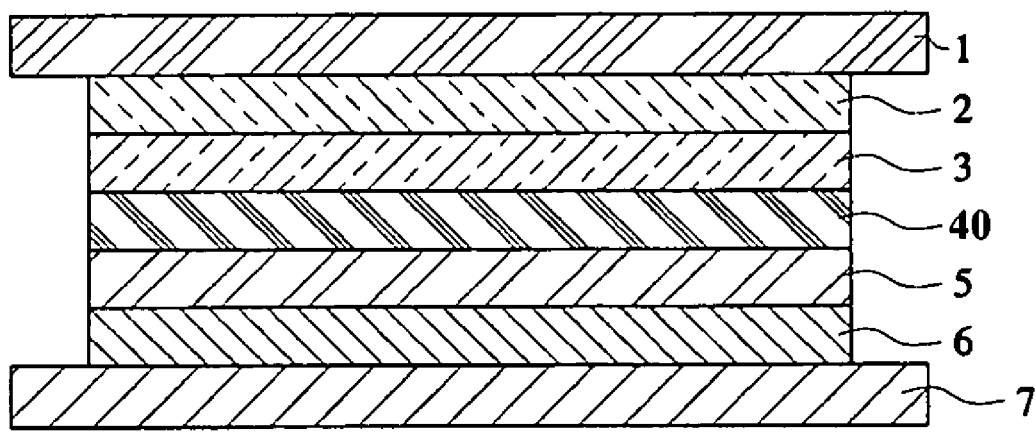
FIG. 2 is a drawing schematically illustrating structure of an organic electroluminescent display device according to an embodiment of the present invention.

FIG. 2 is a drawing schematically illustrating a structure of an organic electroluminescent display device fabricated according to an embodiment of the present invention. Like numerals of FIG. 2 refer to like elements in FIG. 1. Referring to FIG. 2, the shown embodiment of present invention comprises a first electrode 7 and a second electrode 1 sequentially formed on a substrate (not shown). An emission layer 40 is between the first electrode 7 and second electrode 1. The emission layer 40 includes at least one organic film layer and at least two or more dopants as a dopant are used in an emitting host material of the emission layer 40.

A first phosphorescent dopant used in the emission layer 40 of an embodiment of the present invention uses a material having a shorter emitting wavelength range compared to a second phosphorescent dopant so that energy is transferred from the host to the first phosphorescent dopant. The first phosphorescent dopant transfers energy received from the host to the second phosphorescent dopant to emit the second phosphorescent dopant.

An embodiment of the first and second phosphorescent dopants use an organic metal material comprising iridium (Ir) or platinum (Pt). The first phosphorescent dopant should have a shorter emitting wavelength range and a superior emission efficiency as compared to the second phosphorescent dopant according to an aspect of the invention. Energy transferred to the first phosphorescent dopant is efficiently transferred to the second phosphorescent dopant so that the first phosphorescent dopant obtains the same emission efficiency as that of the second phosphorescent dopant. Therefore, a lower emission efficiency of the second phosphorescent dopant is improved by using the first phosphorescent dopant having a higher emission efficiency.

A wavelength difference between the first and second phosphorescent dopants is preferably 50 nm or less. However, other wavelength differences are envisioned.

Furthermore, the life cycle of the second phosphorescent dopant is improved by using the first phosphorescent dopant, which has superior life cycle characteristics as compared to the second phosphorescent dopant. The emission efficiency and the emitting range are determined by the first phosphorescent dopant since the energy is primarily transferred to the first phosphorescent dopant from the host. Therefore, the life cycle of the second phosphorescent dopant is improved by controlling the first phosphorescent dopant. On the other hand, the color coordinates are determined by the second phosphorescent dopant since emission is shown from the second phosphorescent dopant. Accordingly, the first phosphorescent dopant has a superior emission efficiency and life cycle, and the second phosphorescent dopant must have superior color coordinates in order to obtain the optimum characteristics in a device according to an aspect of the invention.

It is preferable, although not required in all aspects of the invention, that the first phosphorescent dopant comprises a phosphorescent organic metal material comprising iridium metal or platinum, and the emission wavelength range of the first phosphorescent dopant is from a blue range to a red range. The second phosphorescent dopant comprises a phosphorescent organic metal material comprising iridium metal or platinum, and the second phosphorescent dopant has a longer wavelength range and a better color purity as compared to the first phosphorescent dopant.

It is more preferable, but not required, that the first phosphorescent dopant has a similar wavelength range to that of the second phosphorescent dopant, and the first phosphorescent dopant has a superior emission efficiency as compared to the second phosphorescent dopant since the color coordinates of the second phosphorescent dopant deteriorate due to the emission of the first phosphorescent dopant should 100% of the energy received by the first phosphorescent dopant from the host not be transferred to the second phosphorescent dopant.

According to an aspect of the invention, the first phosphorescent dopant includes $Ir(ppy)_3$, bis(7,8-benzoquinoline)acetylacetonate iridium, bis(phenylpyridine)acetylacetonate iridium, etc. According to an aspect of the invention, the second phosphorescent dopant includes bisthienylpyridine acetylacetonate iridium, bis(benzothienylpyridine)acetylacetonate iridium, bis(2-phenylbenzothiazole)acetylacetonate iridium, etc. However, it is understood that the present invention is not limited to the foregoing phosphorescent organic metal materials comprising iridium metal.

According to an aspect of the invention, the first phosphorescent dopant is used in a concentration of 0.1 to 30% and the second phosphorescent dopant is used in a concentration of 0.1 to 20% for the total emission layer 40. Furthermore, the first phosphorescent dopant is used in a higher concentration compared to the concentration of the second phosphorescent dopant.

According to an aspect of the invention shown in FIG. 2, the organic electroluminescent display device further comprises a hole injection layer 6 and a hole transport layer 5 between the first electrode 7 and emission layer 40. An electron injection layer 2 and an electron transport layer 3 are between the second electrode 1 and the emission layer 40. However, it is understood that ones of the layers 2, 3, 5, 6 need not be used in all aspects of the invention. According to an aspect of the invention, a hole retardation layer is disposed between the emission layer 40 and the electron transport layer 3.

An organic electroluminescent device of an embodiment of the present invention is has a structure described where the first electrode 7 is the anode electrode. However, according to another embodiment, the structure is reversed where the first electrode 7 is the cathode electrode.

According to an embodiment of the invention, a device having superior emission efficiency and life cycle characteristics as maintaining color coordinates compared to a structure in which an existing phosphorescent dopant is doped on host is fabricated by using the structure of the present invention.

However, there are problems in that a deposition speed of all three materials should be accurately controlled when using a method in which the host, the first phosphorescent dopant and the second phosphorescent dopant are co-deposited from each crucible. Therefore, while possible, it is more difficult to control the concentration of each material compared to an existing process.

In order to solve these and/or other problems, according to an embodiment of the invention, the first phosphorescent dopant and second phosphorescent dopant are mixed in a certain mixing ratio to perform deposition in a crucible. Ratios of the first and second phosphorescent dopants are constantly maintained for deposition of a mixture of host and the first and second phosphorescent dopants. Therefore, the method of an embodiment of the present has merits in that the process is simple and easily controlled compared to a method for depositing the three materials at the same time.

The following examples are provided to further illustrate various aspects of this invention, and are not intended to limit the scope of the invention.

EXAMPLE

Copper phthalocyanine (CuPc) was deposited as the hole injection layer 6 of an organic electroluminescent display device to a thickness of 10 nm on an ITO transparent electrode 7 under a vacuum of $10^{-6}$ torr. N,N'-di(1-naphthyl)-N,N'-diphenylbenzidine (NPD) as a hole transport layer 5 was deposited to a thickness of 50 nm on the deposited hole injection layer 6 under a vacuum of $10^{-6}$ torr.

An emission layer 40 was formed to a thickness of 30 nm on the hole transport layer 5 by deposition of a first phosphorescent dopant comprising iridium tris(phenylpyridine) (Irppy$_3$) and having a maximum emission wavelength of 608 nm and a second phosphorescent dopant comprising 12% of iridium and having a maximum emission wavelength of 616 nm to a concentration of 5% on carbazole biphenyl (CBP) after deposition of the hole transport layer 5 of N,N'-di(1-naphthyl)-N,N'-diphenylbenzidine (NPD).

A hole retardation layer of biphenoxy-bi(8-quinolinolato) aluminum (Balq) was deposited to a thickness of 5 nm on the emission layer 40. An electron transport layer 3 of tris(8-quinolinolato)aluminum (Alq) was deposited to a thickness of 20 nm on the hole retardation layer under vacuum of $10^{-6}$ torr.

An electron injection layer 2 of LiF was deposited to a thickness of 1 nm on the electron transport layer 3 after deposition of the electron transport layer 3. A metal electrode 1 of Al was deposited on the electron injection layer 2 of LiF to a thickness of 300 nm. Finally, the deposited material was encapsulated using a metal can and barium oxide (BaO) after depositing the metal electrode 1 of Al on the electron injection layer 2 of LiF.

An organic electroluminescent display device fabricated using the foregoing process presented luminance of 800 cd/m2, efficiency of 9.8 cd/A and color coordinates (0.64, 0.36) at 6 V, and life cycle of 8,000 hours at 300 cd/m2.

Comparative Example 1

Copper phthalocyanine (CuPc) was deposited as a hole injection layer 6 of an organic electroluminescent display device to a thickness of 10 nm on an ITO transparent electrode 7 under vacuum of $10^{-6}$ torr. N,N'-di(1-naphthyl)-N,N'-diphenylbenzidine (NPD) as a hole transport layer 5 was deposited to a thickness of 50 nm on the hole injection layer 6 under vacuum of $10^{-6}$ torr.

An emission layer 4 was formed to a thickness of 30 nm on the hole transport layer 5 by deposition of the first phosphorescent dopant comprising iridium (Ir) and having the maximum emission wavelength of 608 nm to a concentration of 12% on carbazole biphenyl (CBP) after deposition of the hole transport layer 5 of N,N'-di(1-naphthyl)-N,N'-diphenylbenzidine (NPD).

A hole retardation layer of biphenoxy-bi(8-quinolinolato) aluminum (Balq) was deposited to a thickness of 5 nm on the emission layer 4. An electron transport layer 3 of tris(8-quinolinolato)aluminum (Alq) was deposited to a thickness of 20 nm on the hole retardation layer under a vacuum of $10^{-6}$ torr after depositing the hole retardation layer. An electron injection layer 2 of LiF was deposited to a thickness of 1 nm on the electron transport layer 3 after deposition of the electron transport layer. A metal electrode 1 of Al was deposited on the electron injection layer 2 of LiF to a thickness of 300 nm. Finally, the deposited material was encapsulated using a metal can and barium oxide (BaO) after depositing the metal electrode 1 of Al.

An organic electroluminescent display device fabricated using the foregoing process presented luminance of 800 cd/m2, efficiency of 9.8 cd/A and color coordinates (0.62, 0.38) at 6 V, and life cycle of 8,000 hours at 300 cd/m2.

Comparative Example 2

Copper phthalocyanine (CuPc) was deposited as a hole injection layer 6 of an organic electroluminescent display device to a thickness of 10 nm on an ITO transparent electrode 7 under a vacuum of $10^{-6}$ torr. N'-di(1-naphthyl)-N,N'-diphenylbenzidine (NPD) as a hole transport layer 5 was deposited to a thickness of 50 nm on the hole injection layer 6 under a vacuum of $10^{-6}$ torr. An emission layer 4 was formed to a thickness of 30 nm on the hole transport layer 5 by deposition of the second phosphorescent dopant comprising iridium (Ir) and having the maximum emission wavelength of 616 nm to a concentration of 8% on carbazole biphenyl (CBP) after deposition of the hole transport layer 5.

A hole retardation layer of biphenoxy-bi(8-quinolinolato) aluminum (Balq) was deposited to a thickness of 5 nm on the emission layer 4. An electron transport layer 3 of tris(8-quinolinolato)aluminum (Alq) was deposited to a thickness of 20 nm on the hole retardation layer under vacuum of $10^{-6}$ torr. An electron injection layer 2 of LiF was deposited to a thickness of 1 nm on the electron transport layer 3 after deposition of the electron transport layer 3. A metal electrode 1 of Al was deposited on the electron injection layer 2 of LiF to a thickness of 300 nm. Finally, the deposited material was encapsulated using a metal can and barium oxide (BaO) after depositing a metal electrode 1.

An organic electroluminescent display device fabricated using the foregoing process presented luminance of 800 cd/m2, efficiency of 6.5 cd/A and color coordinates (0.65, 0.36) at 6 V, and life cycle of 2,000 hours at 300 cd/m2. While described in the example for use with wavelengths in the range of 600 nm, it is understood that other colors can be used using similar ranges centered about a desired color and color coordinate.

Therefore, a device having merits of existing each dopant can be fabricated by using a structure in which the first and second phosphorescent dopants comprising iridium are simultaneously used in the present invention.

While the invention has been particularly shown and described with reference to embodiments thereof, it will be understood by those skilled in the art that the foregoing and other changes in form and details may be made therein without departing from the spirit and scope of the invention as defined in the accompanying claims and equivalents thereof.

What is claimed is:

1. An organic electroluminescent display device comprising:
   a first electrode;
   a second electrode; and
   at least one emission layer and charge transport layer disposed between the first electrode and the second electrode,
   wherein:
      the at least one emission layer comprises a host material comprising at least a first phosphorescent dopant and a second phosphorescent dopant other than the first phosphorescent dopant, and
      each of the first phosphorescent dopant and second phosphorescent dopant comprises iridium or platinum.

2. The organic electroluminescent display device according to claim 1, wherein the first phosphorescent dopant has an emission wavelength that overlaps an absorption wavelength of the second phosphorescent dopant so that the first phosphorescent dopant transmits energy to the second phosphorescent dopant.

3. The organic electroluminescent display device according to claim 1, wherein the first phosphorescent dopant has an emission wavelength that is 50 nm or less than an emission wavelength of the second phosphorescent dopant.

4. The organic electroluminescent display device according to claim 1, wherein the at least one emission layer is formed through a deposition process in which the first phosphorescent dopant and second phosphorescent dopant are mixed together in a crucible for use in the deposition process.

5. The organic electroluminescent display device according to claim 1, wherein the at least one emission layer is formed through a deposition process in which the first phosphorescent dopant and the second phosphorescent dopant are co-deposited with an emitting compound.

6. The organic electroluminescent display device according to claim 1, wherein the first phosphorescent dopant is one or more materials selected from the group consisting of Ir(ppy)3, bis(7,8-benzoquinoline)acetylacetonate iridium, and bis(phenylpyridine)acetylacetonate iridium.

7. The organic electroluminescent display device according to claim 1, wherein the first phosphorescent dopant is used in the amount of 0.1 to 30% of the at least one emission layer.

8. The organic electroluminescent display device according to claim 1, wherein the second phosphorescent dopant is one or more materials selected from the group consisting of bisthienylpyridine acetylacetonate iridium, bis(benzothienylpyridine)acetylacetonate iridium, and bis(2-phenylbenzothiazole)acetylacetonate iridium.

9. The organic electroluminescent display device according to claim 1, wherein the second phosphorescent dopant is used in the amount of 0.1 to 20% of the at least one emission layer.

10. The organic electroluminescent display device according to claim 7, wherein the first phosphorescent dopant has a higher concentration as compared to a concentration of the second phosphorescent dopant.

11. The organic electroluminescent display device according to claim 1, wherein the first phosphorescent dopant has a superior emission efficiency as compared to an emission efficiency of the second phosphorescent dopant.

12. The organic electroluminescent display device according to claim 1, wherein the first phosphorescent dopant comprises a first type of the iridium and the second phosphorescent dopant comprises a second type of the iridium other than the first type.

13. An organic electroluminescent display device comprising:
   a first electrode;
   a second electrode; and
   an emission layer disposed between the first electrode and the second electrode and comprising a first phosphorescent dopant having a first emitting wavelength and a second phosphorescent dopant other than the first phosphorescent dopant and having a second emitting wavelength which is substantially similar to but other than the first emitting wavelength such that the first phosphorescent dopant transfers received energy to the second phosphorescent dopant to emit light from the second phosphorescent dopant.

14. The organic electroluminescent display device according to claim 13, wherein the first phosphorescent dopant comprises a first type of iridium and the second phosphorescent dopant comprises a second type of iridium other than the first type of iridium.

15. The organic electroluminescent display device according to claim 13, wherein the first emitting wavelength is shorter than the second emitting wavelength.

16. The organic electroluminescent display device according to claim 13, wherein the first phosphorescent dopant has an emission efficiency that is greater than an emission efficiency of the second phosphorescent dopant.

17. The organic electroluminescent display device according to claim 13, wherein the first phosphorescent dopant has a life cycle characteristic that is greater than a life cycle characteristic of the second phosphorescent dopant.

18. The organic electroluminescent display device according to claim 13, wherein the second emission wavelength is closer to a target color coordinate for a corresponding pixel as compared to the first emission wavelength.

19. The organic electroluminescent display device according to claim 13, wherein:
   the first phosphorescent dopant is used in a first concentration of 0.1 to 30% of the emission layer,
   the second phosphorescent dopant is used in a second concentration of 0.1 to 20% of the emission layer, and
   the first concentration is greater than the second concentration.

20. The organic electroluminescent display device according to claim 13, wherein the first phosphorescent dopant comprises a first type of a material and the second phosphorescent dopant comprises a second type of the material other than the first type of the material.

21. The organic electroluminescent display device according to claim 13, wherein a difference in the first emitting wavelength and the second emitting wavelength is 50 nm or less and greater than zero.

22. The organic electroluminescent display device according to claim 13, wherein the first phosphorescent dopant is one or more materials selected from the group consisting of Ir(ppy)3, bis(7,8-benzoquinoline)acetylacetonate iridium, and bis(phenylpyridine)acetylacetonate iridium.

23. The organic electroluminescent display device according to claim 13, wherein the second phosphorescent dopant is one or more materials selected from the group consisting of bisthienylpyridine acetylacetonate iridium, bis(benzothienylpyridine)acetylacetonate iridium, and bis(2-phenylbenzothiazole)acetylacetonate iridium.

* * * * *